(12) United States Patent
Pei et al.

(10) Patent No.: US 8,009,980 B2
(45) Date of Patent: Aug. 30, 2011

(54) LIGHT BLOCKING PLATE, CAMERA MODULE HAVING SAME, AND METHOD FOR MAKING SAME

(75) Inventors: Shao-Kai Pei, Tu-Cheng (TW); Zih-Wei Wang, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/758,038

(22) Filed: Apr. 12, 2010

(65) Prior Publication Data

US 2011/0052180 A1    Mar. 3, 2011

(30) Foreign Application Priority Data

Aug. 31, 2009  (CN) .................. 2009 1 0306336

(51) Int. Cl.
*G03B 11/00*    (2006.01)
(52) U.S. Cl. ......................................... 396/544
(58) Field of Classification Search .................. 396/544; 427/134
See application file for complete search history.

(56) References Cited

U.S. PATENT DOCUMENTS

| | | | | | |
|---|---|---|---|---|---|
| 2,806,271 | A | * | 9/1957 | Operhall | 164/24 |
| 3,177,084 | A | * | 4/1965 | Amstein | 428/408 |
| 3,180,632 | A | * | 4/1965 | Katz et al. | 432/264 |
| 3,537,949 | A | * | 11/1970 | Brown et al. | 428/472 |
| 5,031,120 | A | * | 7/1991 | Pomerantz et al. | 700/120 |

* cited by examiner

*Primary Examiner* — Clayton E LaBalle
*Assistant Examiner* — Leon W Rhodes, Jr.
(74) *Attorney, Agent, or Firm* — Altis Law Group, Inc.

(57) ABSTRACT

An exemplary light blocking plate includes a light pervious substrate, a filter film formed on the light pervious substrate, and a metal film layer formed on the light pervious substrate and the optical filter film. The metal film layer defines a through hole to expose a central portion of the optical filter film.

7 Claims, 12 Drawing Sheets

LIGHT BLOCKING PLATE, CAMERA MODULE HAVING SAME, AND METHOD FOR MAKING SAME

BACKGROUND

1. Technical Field

The present disclosure relates to optical imaging and particularly to, a light blocking plate, a camera module with the light blocking plate, and a method for making the light blocking plate.

2. Description of Related Art

Nowadays, camera modules have been widely used in various portable electronic devices, such as mobile phones, and personal digital assistants (PDAs). The camera modules of the portable electronic devices have become smaller and smaller in size. Accordingly, it is required that optical elements (e.g., a light blocking plate) used in the camera module have a smaller size/volume.

A typical light blocking plate is made by processing a plastic/metal tape under exposure, developing, etc. The equipment used in the process of the developing is very expensive, and the process of the developing is harmful to environment. In addition, the thickness of the light blocking plate is generally larger than 30 μm. Such a light blocking plate may not meet the demand for the miniaturization of the lens module.

Therefore, what is needed is a new light blocking plate, a new method for making the light blocking plate, and a new camera module with the light blocking plate which can overcome the above-mentioned problems.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Embodiments will now be described in detail below with reference to the drawings.

Figure 1:
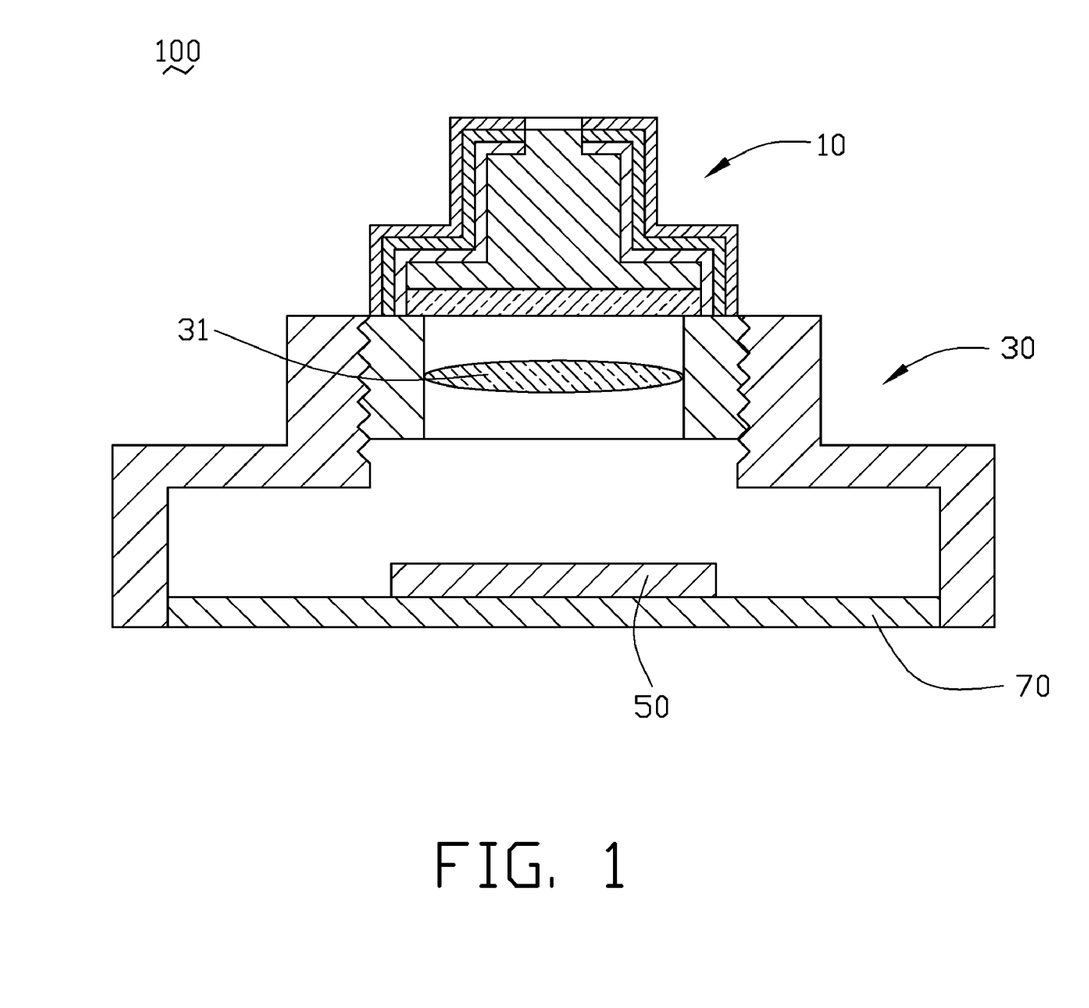
FIG. 1 is a schematic cross-section view of a camera module according to an exemplary embodiment.

Referring to FIG. 1, a camera module 100, in accordance with an exemplary embodiment, is shown. The camera module 100 includes a light blocking plate 10, a lens module 30 for receiving a lens 31 therein, an image sensor 50, and a circuit board 70 for supporting the image sensor 50.

Figure 2:
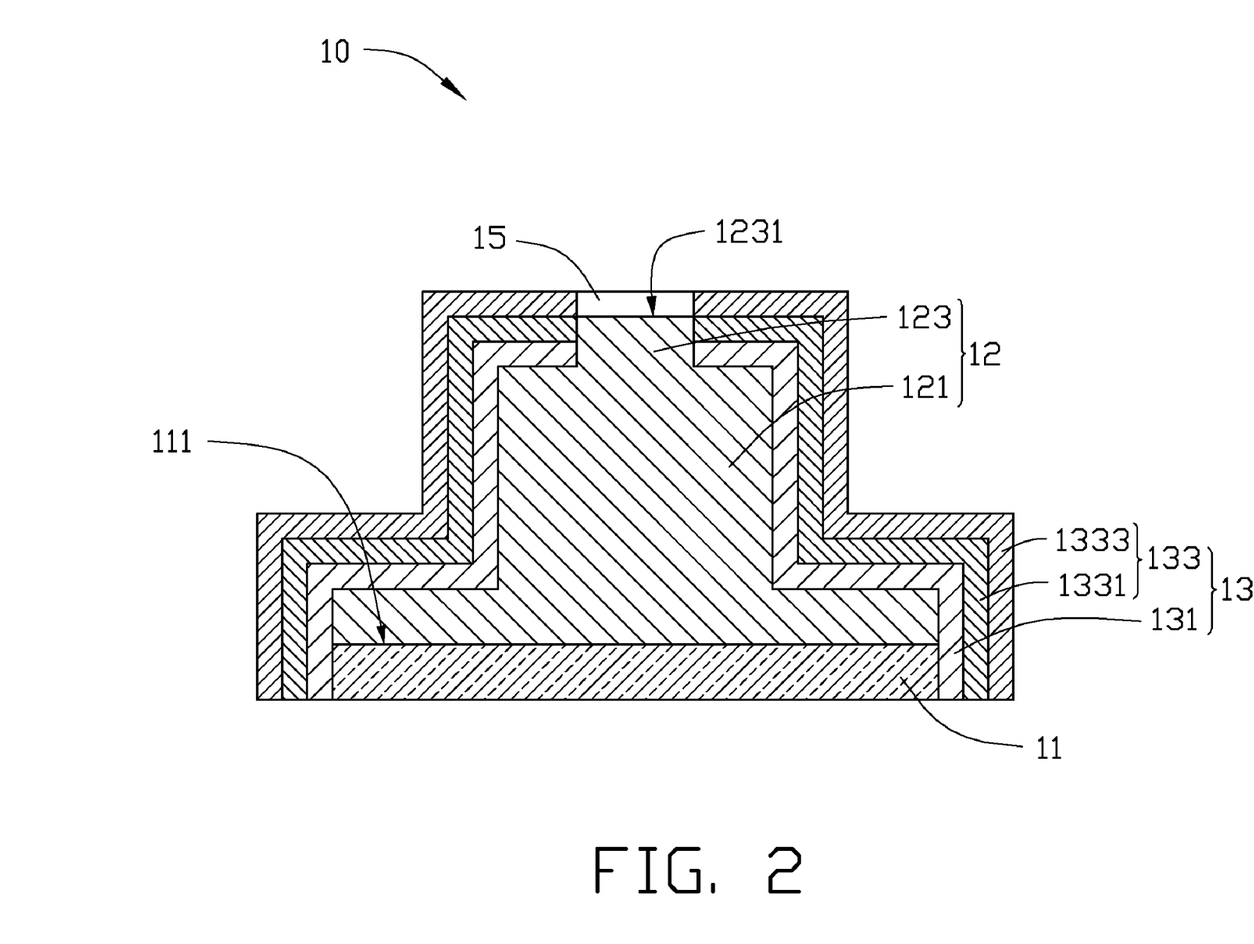
FIG. 2 is a schematic cross-section view of a light blocking plate of the camera module of FIG. 1.

Referring to FIG. 2, the light blocking plate 10 is mounted on the top surface of the lens module 30 for absorbing stray light. The light blocking plate 10 includes a light pervious substrate 11, an optical filter film 12 formed on the light pervious substrate 11, and a metal film layer 13 formed on the light pervious substrate 11 and the optical filter film 12. In an alternative embodiment, the light blocking plate 10 may instead be received in the lens module 30, and be under/on the lens 31.

The light pervious substrate 11 is made of glass for allowing light to pass therethrough, thereby allowing light to reach the lens 31. In alternative embodiments, the light pervious substrate 11 may instead be made of plastic. The light pervious substrate 11 includes a supporting surface 111 for supporting the optical filter film 12 thereon.

The optical filter film 12, in the illustrated embodiment, is an infrared cut-off optical filter film, and is formed on the supporting surface 111. The optical filter film 12 includes a main portion 121, and a protrusion 123 formed on the main portion 121. The shape of the cross-section of the main portion 121 is an inverted T-shaped. The protrusion 123 includes an upper surface 1231, and the shape of the cross-section of the protrusion 123 is substantially rectangular. In alternative embodiments, the optical filter film 12 may instead be a low pass optical filter film, an ultraviolet cut-off optical filter film, etc. In other alternative embodiments, the shape of the cross-section of the main portion 121 may instead be rectangular, trapezoid, etc. In yet still other alternative embodiment, the protrusion 123 may be omitted.

The metal film layer 13 is formed on the light pervious substrate 11 and the optical filter film 12. The metal film layer 13 defines a through hole 15 to expose the protrusion 123, thereby allowing light to reach the optical filter film 12. In the present embodiment, the metal film layer 13 is formed on the peripheral side surface of the light pervious substrate 11 and the optical filter film 12 with the upper surface of the protrusion 123 exposed via the through hole 15. In alternative embodiment, the protrusion 123 may be omitted.

The metal film layer 13 is a multi-layered structure, and includes a light blocking layer 131 in contact with the optical filter film 12, and an electromagnetic shielding layer 133 formed on the light blocking layer 131.

The light blocking layer 131 is configured for absorbing stray light, thereby preventing the stray light from reaching the optical filter film 12. In the present embodiment, the light blocking layer 131 is made of chromium nitride. In alternative embodiments, the light blocking layer 131 may instead be made of chromium, titanium nitride, etc.

The electromagnetic shielding layer 133 is configured for preventing external electromagnetic wave from interfering the normal operation of the image sensor 50. The electromagnetic shielding layer 133 is a multi-layered structure, and includes a copper film layer 1331 formed on the light blocking layer 131, and a stainless steel film layer 1333 formed on the copper film layer 1331. The stainless steel film layer 1333 is configured for not only shielding external electromagnetic field, but also preventing the copper film layer 1331 from being oxidized, thereby improving electromagnetic shielding performance of the electromagnetic shielding layer 133. In alternative embodiment, the electromagnetic shielding layer 133 may instead be a single-layered structure. In other alternative embodiments, the electromagnetic shielding layer 133 may instead be made of any other electromagnetic shielding material, such as ferronickel alloy, electrically conductive plastic, surface conductive material, electrically conductive glass, etc.

A method for making the light blocking plate 10 will be described in detail.

Figure 3:
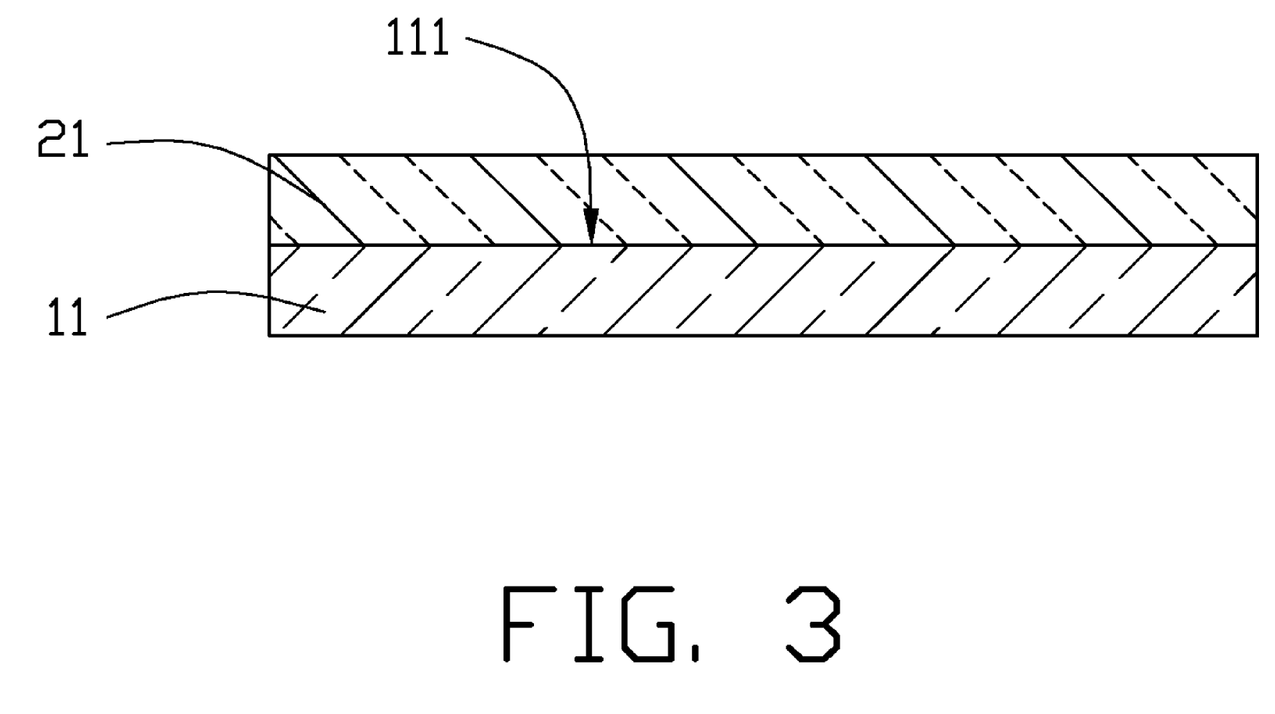
FIGS. 3-12 are cross-sectional views illustrating successive stages in a process for making the light blocking plate of FIG. 2.

Referring to FIG. 3, the light pervious substrate 11 is firstly provided. Then, a ceramic powder layer 21 is formed on the supporting surface 111 of the light pervious substrate 11. In the present embodiment, the ceramic powder layer 21 is made of a compound of silicon dioxide, aluminum phosphate, and water, and is formed on the supporting surface 111 by spin coating. In the compound of silicon dioxide, aluminum phosphate, and water, the weight percent of the silicon dioxide is in a range from 40 percent to 45 percent, the weight percent of the aluminum phosphate is in a range from 5 percent to 10 percent, and the weight percent of the water is in a range from 45 percent to 50 percent.

Figure 4:
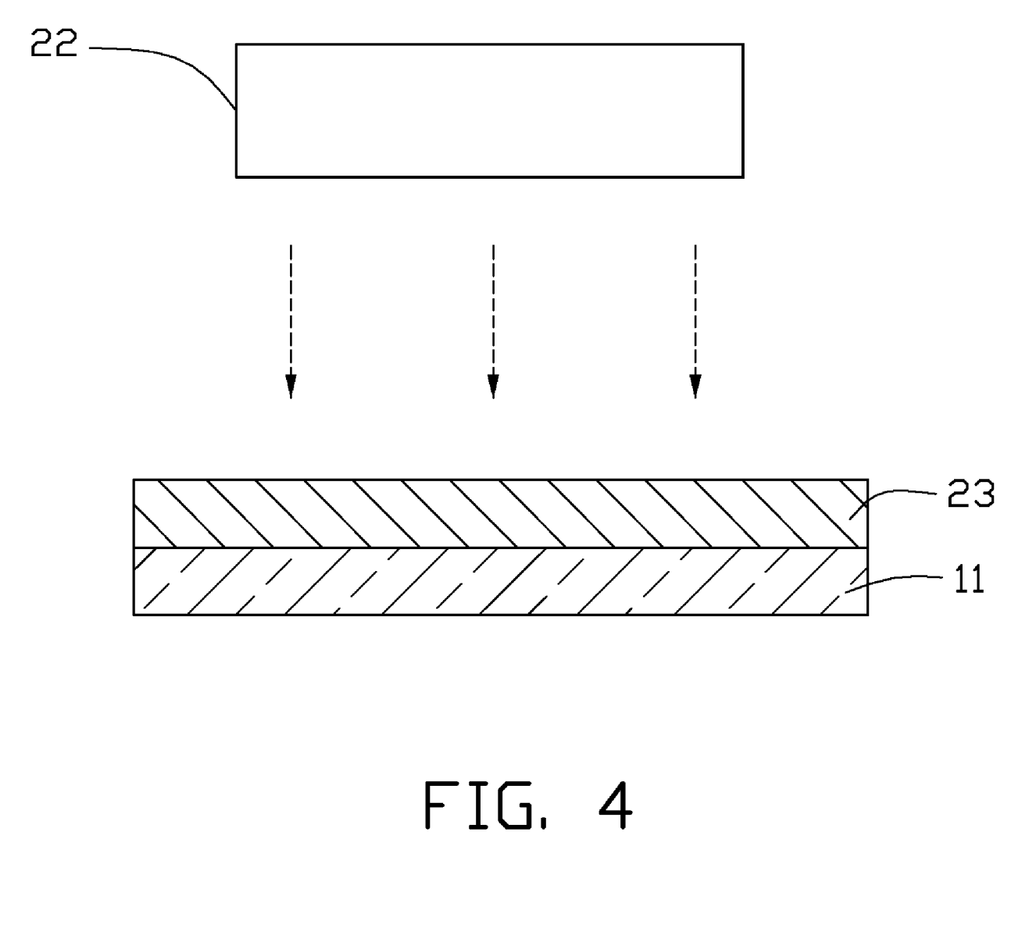

Referring to FIG. 4, the ceramic powder layer 21 is half cured by laser beam modulation hardening. The light pervious substrate 11 with the ceramic powder layer 21 is disposed under many laser heads 22 to make the ceramic powder layer 21 half cured, thereby making the ceramic power layer 21 become a half cured ceramic powder layer 23. The temperature of the laser beam modulation hardening is in a range from 100 degrees centigrade to 200 degrees centigrade. In the present embodiment, the temperature of the laser beam modulation hardening is 130 centigrades.

Figure 5:
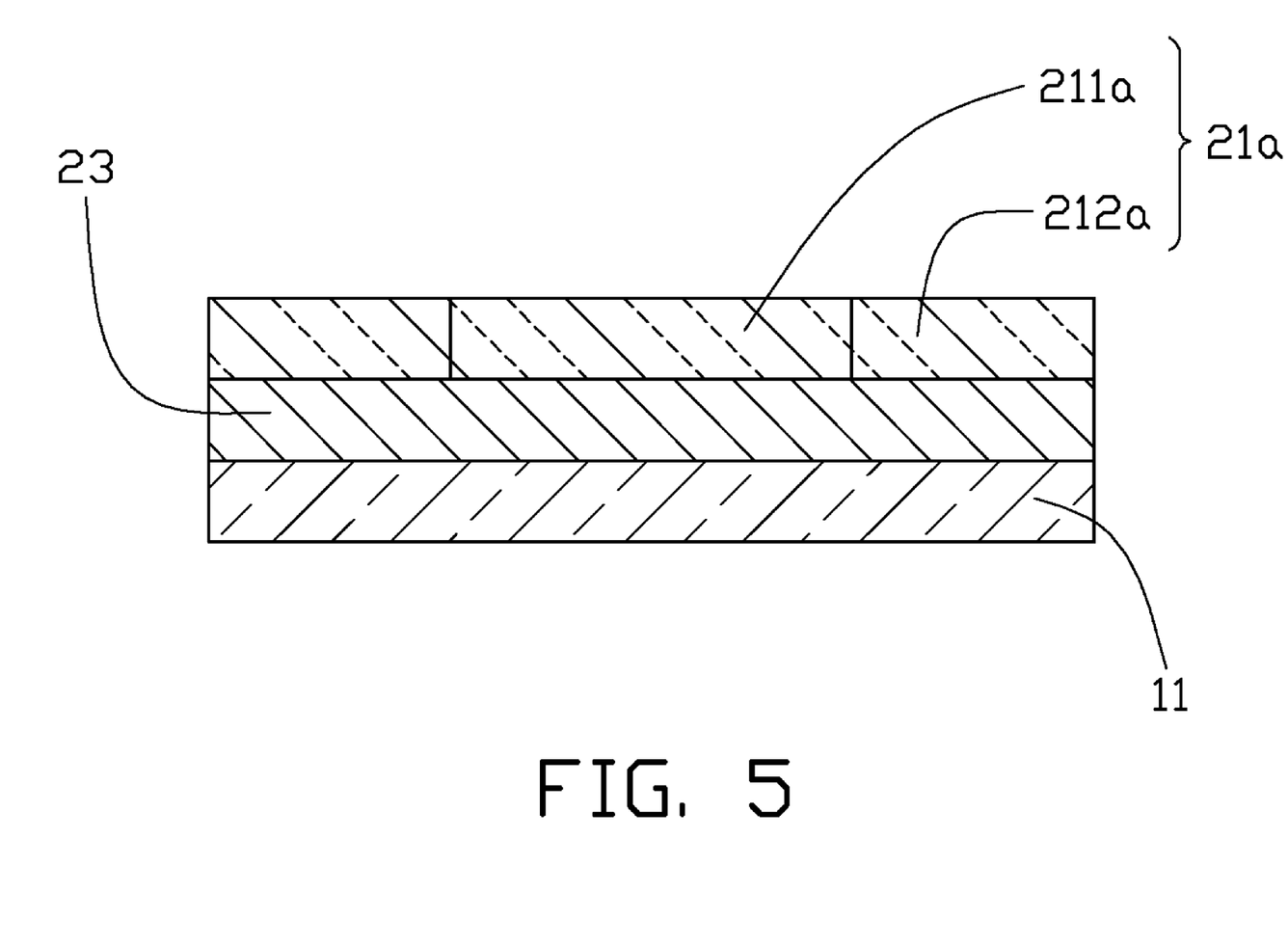

Referring to FIG. 5, a ceramic powder layer 21a is applied on the half cured ceramic powder layer 23 by spin coating. The ceramic powder layer 21a includes a central portion 211a, and a periphery portion 212a surrounding the central portion 211a. In alternative embodiment, the ceramic powder layer 21a may be omitted.

Figure 6:
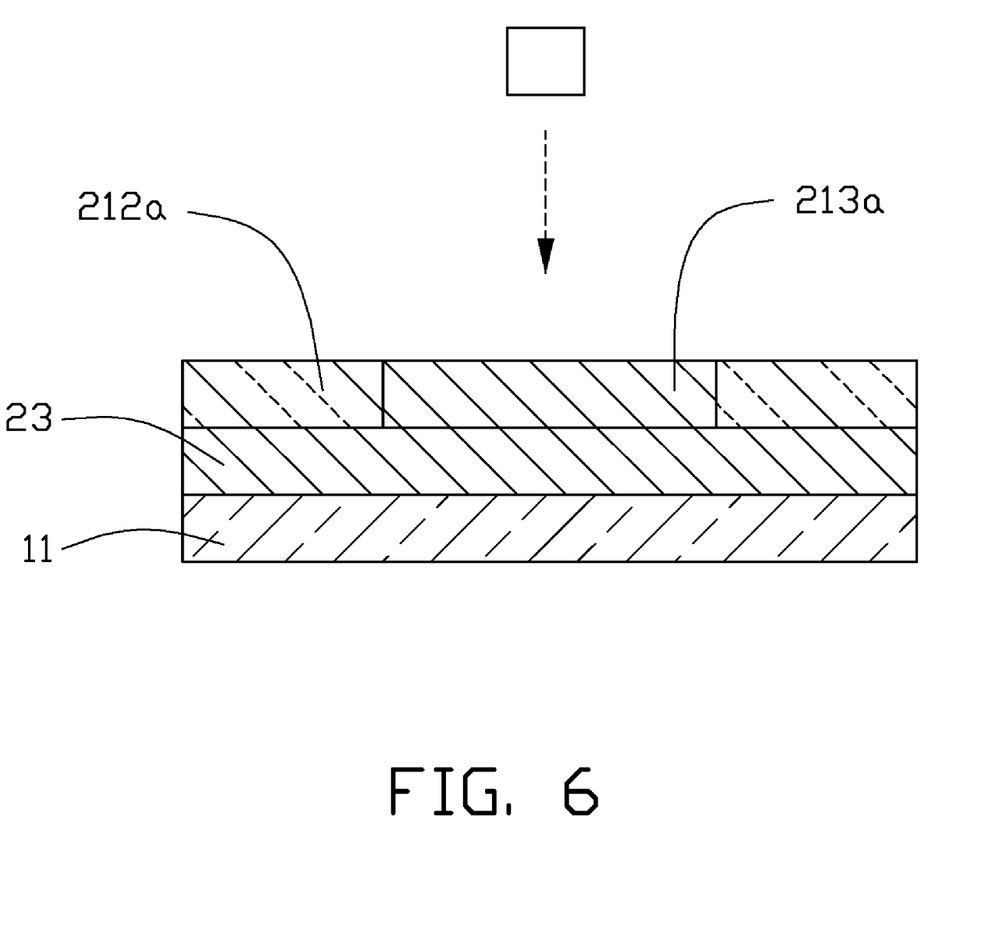

Referring to FIG. 6, the central portion 211a of the ceramic powder layer 21a is half-hardened by laser beam modulation hardening to become a half-cured central portion 213a, and the periphery portion 212a of the ceramic powder layer 21a is not cured. Then, the periphery portion 212a of the ceramic layer 21a is removed from the half cured ceramic powder layer 23 by water (not shown).

Figure 7:
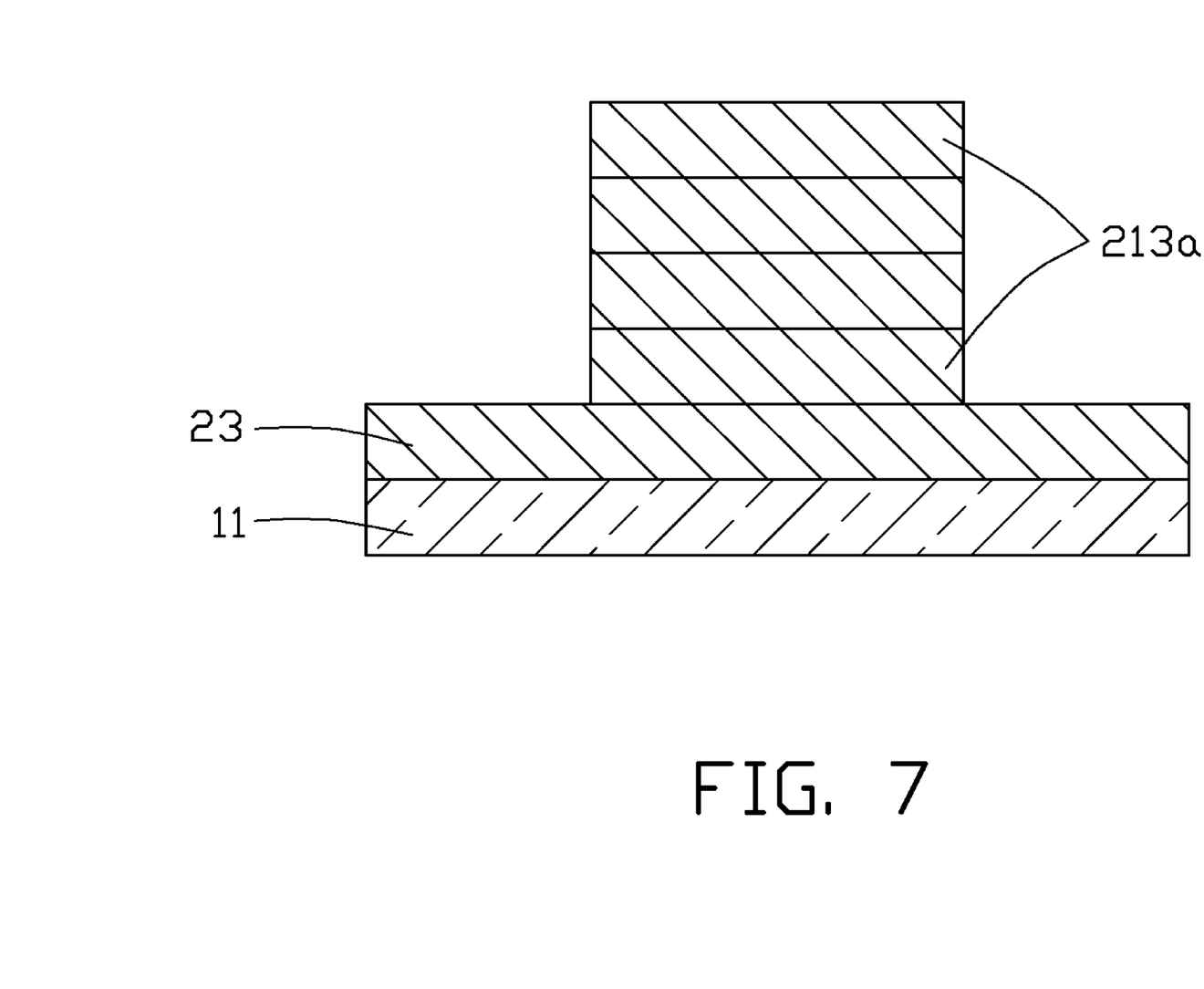

Referring to FIG. 7, in order to make a optical filter film 20 have a given height, there are four half cured central portions 213a applied on the half cured ceramic powder layer 23 by the above-mentioned method. In alternative embodiments, the number of the half cured central portions 213a may instead be one, two, three, etc.

Figure 8:
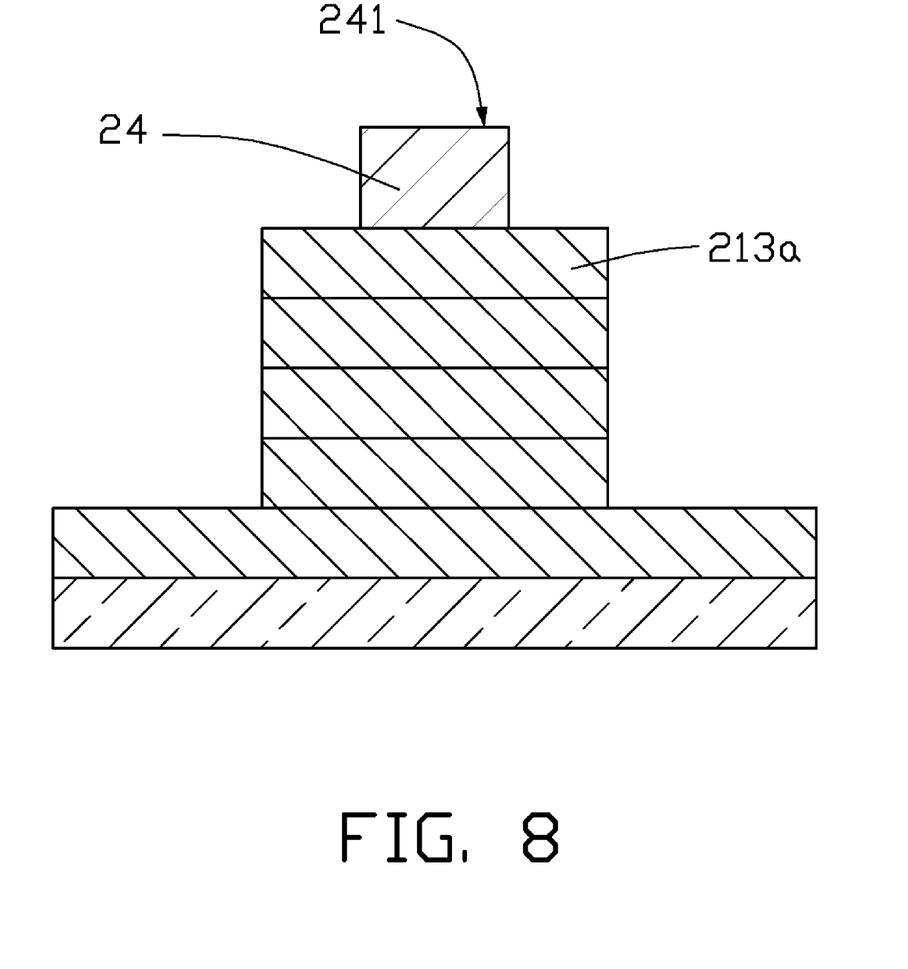

Referring to FIG. 8, an ultraviolet curing resin 24 is applied at the center of the outmost half cured central portion 213a, and is cured by ultraviolet light (not shown). The ultraviolet curing resin 24 is configured for conveniently forming a through hole 16 (see FIG. 10) in the following process, and includes an upper surface 241.

Figure 9:
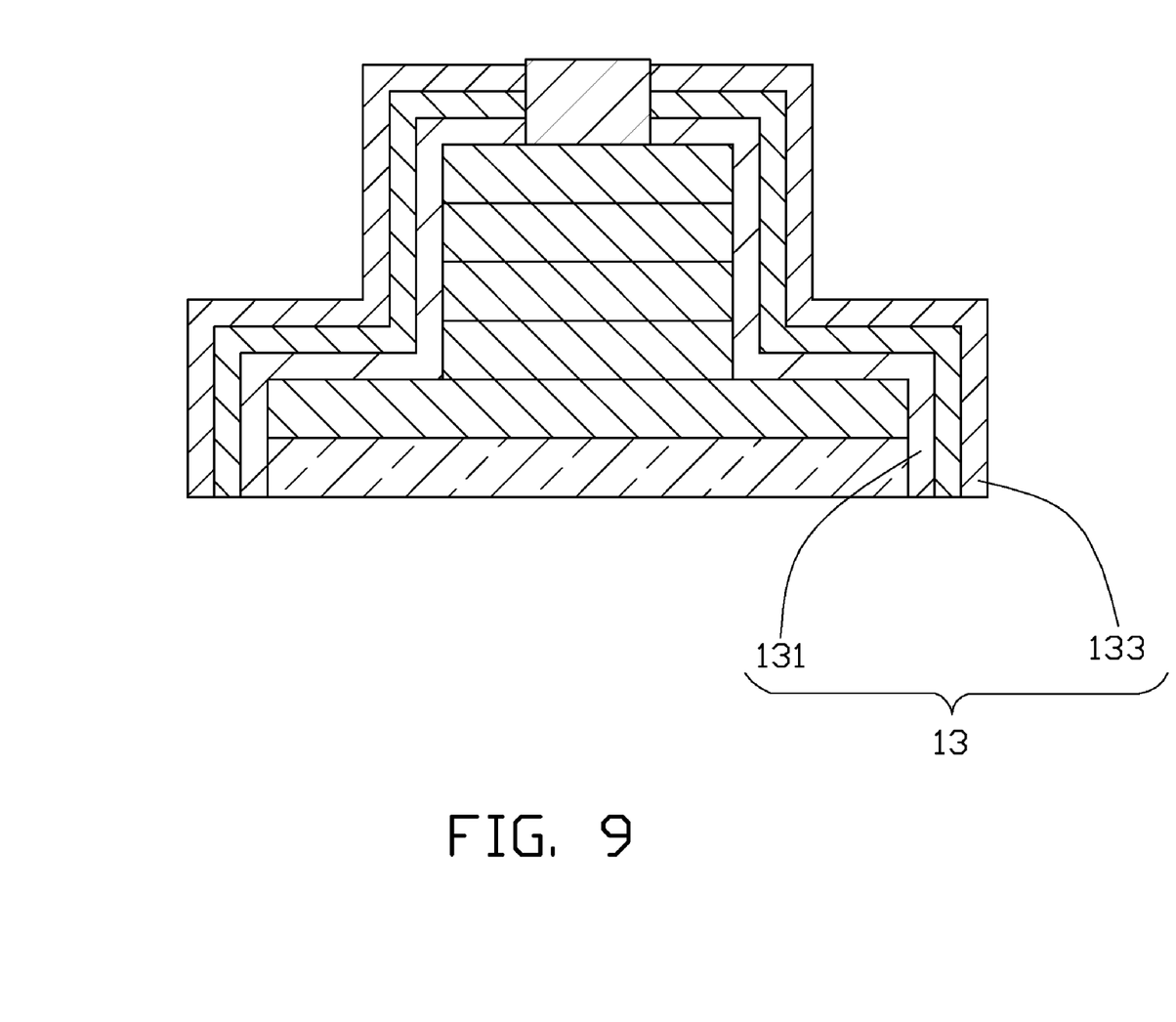

Referring to FIG. 9, the metal film layer 13 is applied on the peripheral side surface of the light pervious substrate 11, the half cured ceramic power layer 23, the half cured central portions 213a, and the ultraviolet curing resin 24 with the exception of the upper surface 241. The height of the metal film layer 12 is less than or equal to the height of the ultraviolet curing resin 24 for conveniently forming the through hole 16. In the present embodiment, from the inside to the outside, the metal film layer 13 includes the light blocking layer 131, and the electromagnetic shielding layer 133 in that order.

Figure 10:
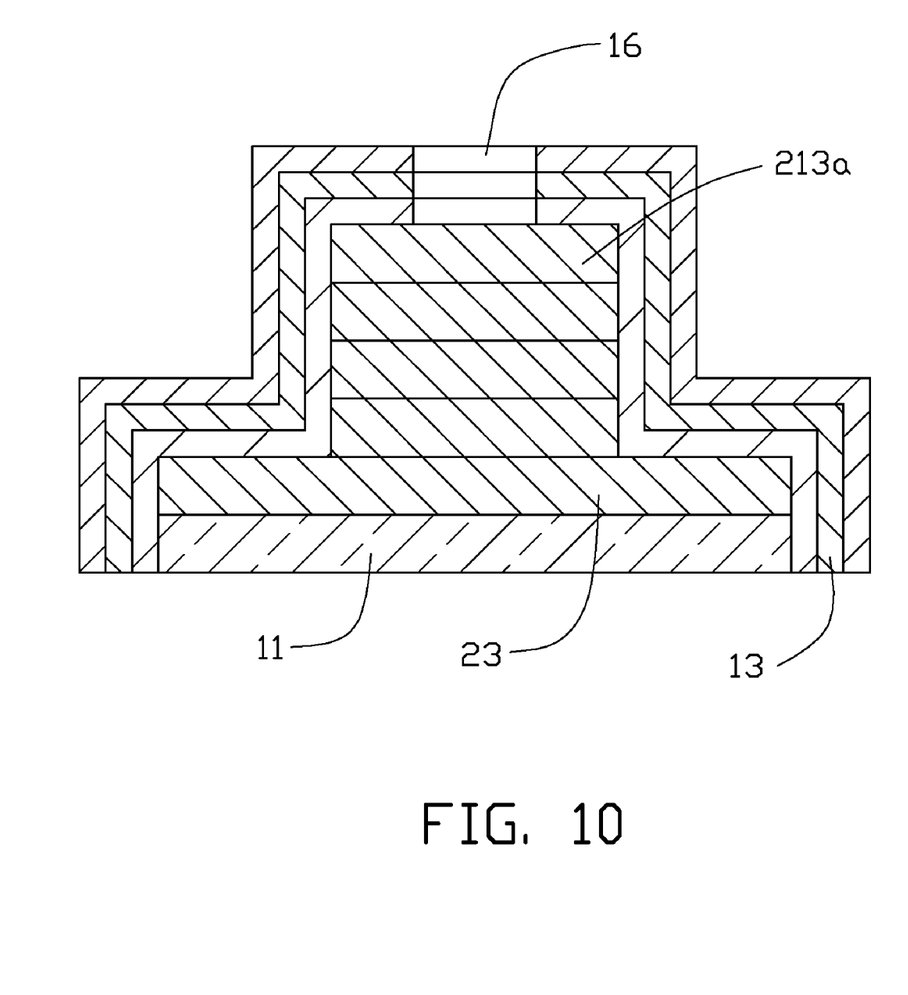

Referring to FIG. 10, the ultraviolet curing resin 24 is removed from the outmost half cured central portion 213a by alcohol (not shown) to form the through hole 16.

Figure 11:
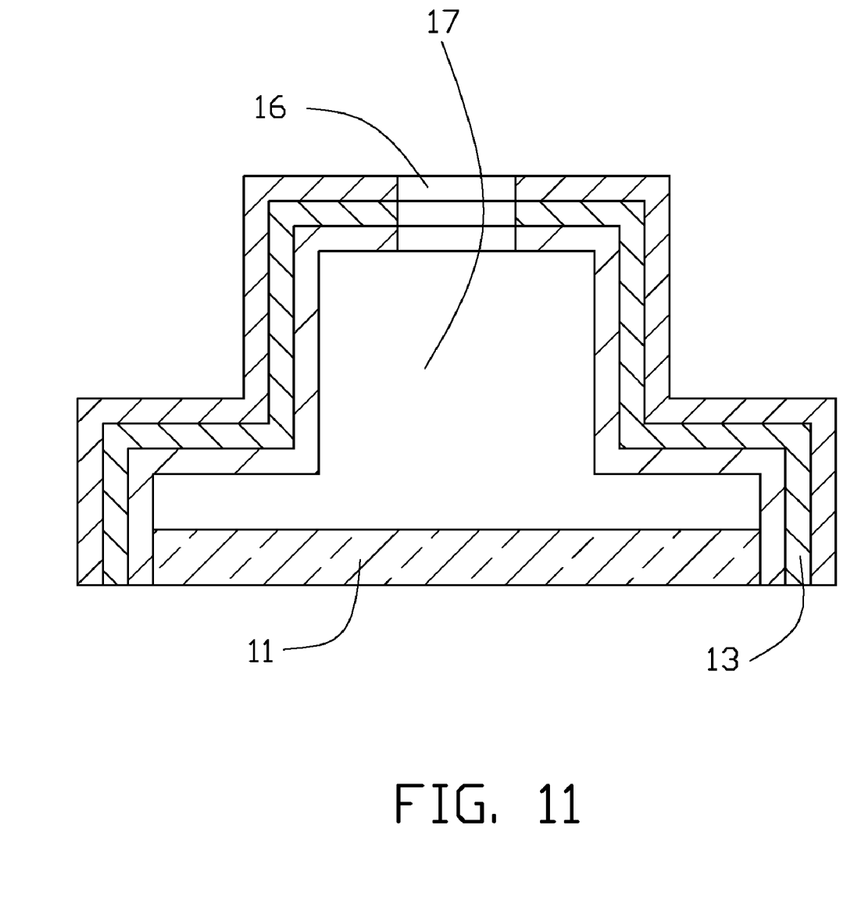

Referring to FIG. 11, the half cured central portions 213a, and the half cured ceramic power layer 23 are removed from the light pervious substrate 11 and the metal film layer 13 to form a receiving cavity 17 communicating with the through hole 16 and bounded by the metal film layer 13 and the light pervious substrate 11. In the present embodiment, the half cured central portions 213a, and the half cured ceramic power layer 23 are fully cured at a temperature higher than the temperature of the half cured process. Thereby weakening the adhesive force between the half cured central portions 213a, the half cured ceramic power layer 23, and the metal film layer 13, and the adhesive force between the half cured ceramic power layer 23 and the light pervious substrate 11. Thus, the half cured central portions 213a, and the half cured ceramic power layer 23 can be easily removed from the metal film layer 13, and the light pervious substrate 11 by alcohol (not shown) or acetone (not shown).

Figure 12:
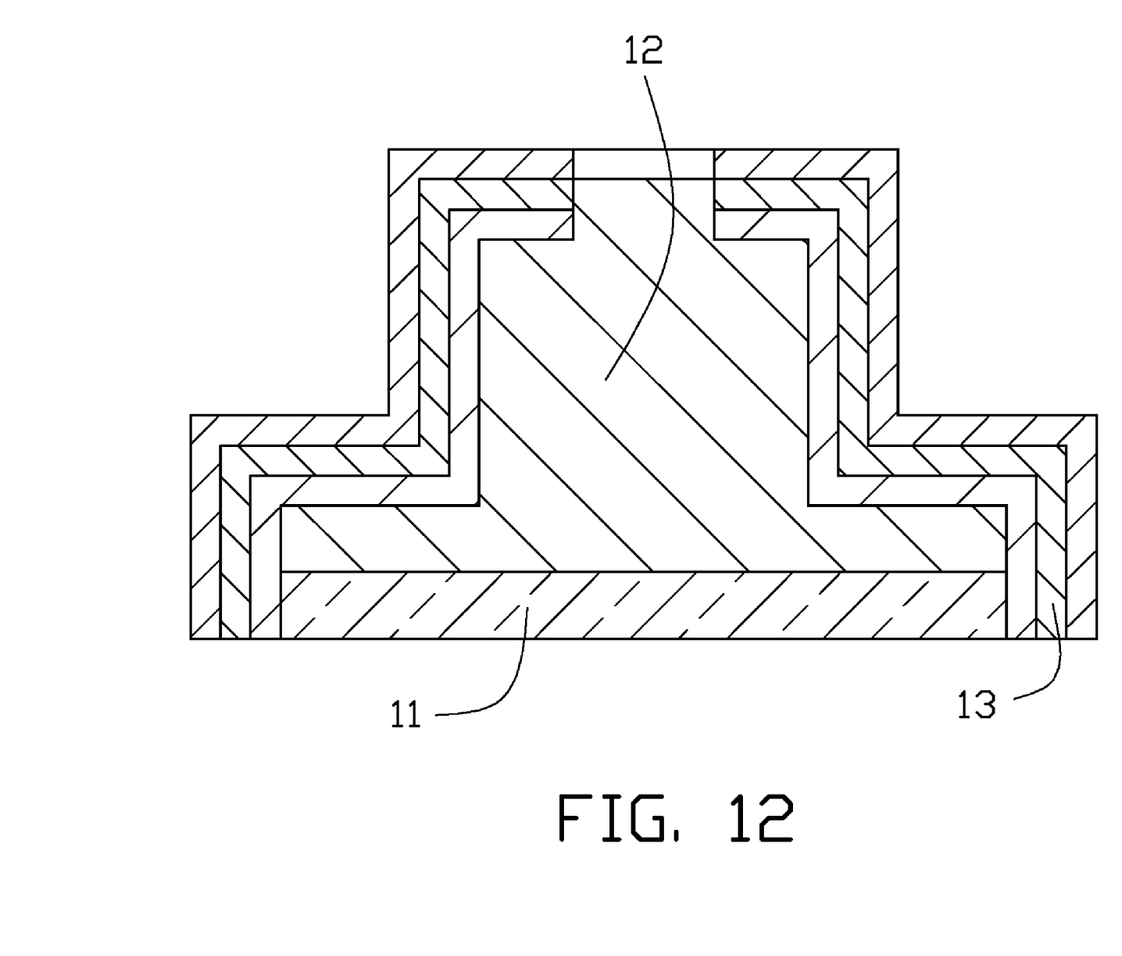

Referring to FIG. 12, the optical filter film 12 is applied in the receiving cavity 17 and the through hole 16 by ion assisted deposition to form the light blocking plate 10. In alternative embodiment, before forming the optical filter film 12, a ceramic power layer (not shown) may be applied on the outer surface of the metal film layer 13 to prevent the outer surface of the metal film layer 13 being coated with an optical filter film in the subsequent ion assisted deposition. In such case, after forming the optical filter film 12 in the through hole 16 and the receiving cavity 17, the ceramic power layer applied on the outer surface of the metal film layer 13 can be removed from the metal film layer 13 by water (not shown). In other alternative embodiment, the optical filter film 12 may only be applied in the receiving cavity 17.

In the method of making the light blocking plate 10, the ceramic power used as a auxiliary material is cured by laser hardening, and is removed by water or alcohol. Thus, there is no need to use expensive development. Accordingly, the cost of making the light blocking plate 10 has lowered. In addition, the light blocking plate 10 can not only absorb stray light, but also prevent external electromagnetic wave from interfering with the normal operation of the image sensor. Accordingly, the imaging quality of the camera module 100 with the light blocking plate 10 can be improved.

While certain embodiments have been described and exemplified above, various other embodiments from the foregoing disclosure will be apparent to those skilled in the art. The present disclosure is not limited to the particular embodiments described and exemplified but is capable of considerable variation and modification without departure from the scope and spirit of the appended claims.

What is claimed is:

1. A method for making a light blocking plate, comprising:
   providing a light pervious substrate;
   applying a ceramic powder layer on the light pervious substrate;
   half curing the ceramic powder layer to make the ceramic powder layer become a half cured ceramic powder layer;
   applying a metal film layer on the peripheral side surface of the light pervious substrate and the half cured ceramic powder layer except the central portion of the half cured ceramic powder layer;
   fully curing the half cured ceramic powder layer;
   removing the fully cured ceramic powder layer from the light pervious substrate and the metal film layer to form a receiving cavity cooperatively bounded by the metal film layer and the light pervious substrate; and
   applying a filter film in the receiving cavity by ion assisted deposition to form the light blocking plate.

2. The method of claim 1, wherein the metal film layer comprises a light blocking layer formed on the optical filter film, and an electromagnetic shielding layer formed on the light blocking layer.

3. The method of claim 2, wherein the electromagnetic shielding layer comprises a copper film layer formed on the light blocking layer, and a stainless steel film layer formed on the copper film layer.

4. The method of claim 1, wherein the ceramic powder layer is comprised of silicon dioxide, aluminum phosphate, and water.

5. The method of claim 4, wherein the weight percent of the silicon dioxide in the ceramic powder layer is in a range from 40 percent to 45 percent, the weight percent of the aluminum phosphate in the ceramic powder layer is in a range from 5 percent to 10 percent, and the weight percent of the water in the ceramic powder layer is in a range from 45 percent to 50 percent.

6. The method of claim 4, wherein the ceramic powder layer is half cured by laser beam modulation hardening.

7. The method of claim 6, wherein the temperature of the laser beam modulation hardening is in a range from 100 degrees Centigrade to 200 degrees Centigrade.

* * * * *